United States Patent
Cho

(10) Patent No.: US 7,408,487 B2
(45) Date of Patent: Aug. 5, 2008

(54) METHOD AND APPARATUS FOR CABAC-BASED ENCODING HAVING HIGH COMPRESSION RATIO USING IMPROVED CONTEXT MODEL SELECTION AND METHOD AND APPARATUS FOR CABAC-BASED DECODING

(75) Inventor: Young-woo Cho, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 19 days.

(21) Appl. No.: 11/655,241

(22) Filed: Jan. 19, 2007

(65) Prior Publication Data

US 2007/0194953 A1 Aug. 23, 2007

(30) Foreign Application Priority Data

Feb. 22, 2006 (KR) .................. 10-2006-0017239

(51) Int. Cl.
*H03M 7/00* (2006.01)
(52) U.S. Cl. .................. 341/107; 341/51; 382/239; 382/247
(58) Field of Classification Search .................. 341/107; 382/239, 247
See application file for complete search history.

(56) References Cited

U.S. PATENT DOCUMENTS 6,900,748 B2 * 5/2005 Marpe et al. ................ 341/107
7,088,271 B2 * 8/2006 Marpe et al. ................ 341/107
7,304,590 B2 * 12/2007 Park ........................... 341/107

FOREIGN PATENT DOCUMENTS

WO 2006/006936 A1 1/2006

OTHER PUBLICATIONS

Khanh Nguyen-Phi et al.: "A new binary source coder and its application in bi-level image compression", Global Telecommunications Conference, 1996. Globecom '96. Communications: The Key to Global Prosperity London, UK, Nov. 18-22, 1996, New York, NY, IEEE, vol. 3, Nov. 18, 1996, pp. 1483-1487.

(Continued)

*Primary Examiner*—Khai M Nguyen
(74) *Attorney, Agent, or Firm*—Sughrue Mion, PLLC

(57) ABSTRACT

A method and an apparatus are provided for context-based adaptive binary arithmetic coding (CABAC) based encoding or decoding using improved selection of a context model for a high compression ratio. The method of CABAC-based encoding includes selecting a first context model based on statistics of previously input symbols and a second context model having a value of a most probable symbol (MPS) different from that of the first context model, encoding a current input symbol using the first context model if the current input symbol has a same value as that of the most probable symbol of the first context model or if the second context model cannot be selected, and encoding the current input symbol using the second context model if the current input symbol has a value different from the most probable symbol of the first context model and if the second context model can be selected.

14 Claims, 7 Drawing Sheets

OTHER PUBLICATIONS

Marpe D et al.: "Context-based Adaptive Binary Arithmetic Coding in the H.264/AVC Video Compression Standard", IEEE Transactions on Circuits and Systems for Video Technology, IEEE Service Center, Piscataway, NJ, vol. 13, No. 7, Jul. 2003, pp. 620-636.

Shengkuan Xiao et al.: "A context-weighing algorithm achieving model adaptability in lossless bi-level image compression", Proceedings 2003 International Conference on Image Processing. ICIP-2003. Barcelona, Spain, Sep. 14-17, 2003, International Conference on Image Processing, New York, NY: IEEE, US, vol. 2 of 3, Sep. 14, 2003, pp. 231-234.

* cited by examiner

FIG. 5A
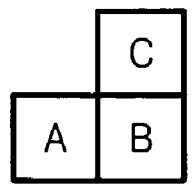
FIG. 5B
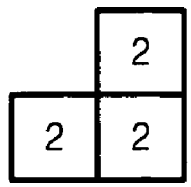
FIG. 5C
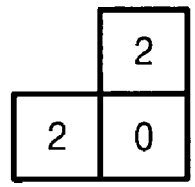
FIG. 6A
| mvd | BINARY VALUE |
|---|---|
| 0 | ⓪ |
| 1 | ① 0 |
| 2 | ① 1 0 |
| 3 | ① 1 1 0 |
| 4 | ① 1 1 1 0 |
| ... | ... |
FIG. 6B
CURRENT INPUT SYMBOL
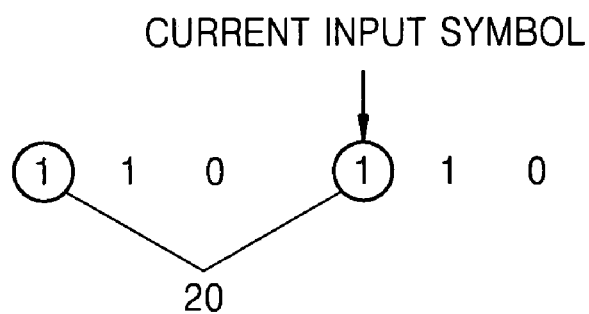
20
FIG. 6C
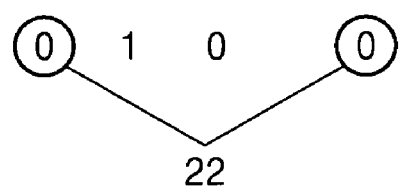
22

METHOD AND APPARATUS FOR CABAC-BASED ENCODING HAVING HIGH COMPRESSION RATIO USING IMPROVED CONTEXT MODEL SELECTION AND METHOD AND APPARATUS FOR CABAC-BASED DECODING

CROSS-REFERENCE TO RELATED PATENT APPLICATION

This application claims the benefit of Korean Patent Application No. 10-2006-0017239, filed on Feb. 22, 2006 in the Korean Intellectual Property Office, the disclosure of which is incorporated herein in its entirety by reference.

BACKGROUND OF THE INVENTION

1. Field of the Invention

Methods and apparatuses consistent with the present invention relate to context-based adaptive binary arithmetic coding (CABAC), and more particularly, to CABAC-based encoding or decoding using improved selection of a context model to obtain a high compression ratio.

2. Description of the Related Art

CABAC is an algorithm used for compressing a motion picture. The CABAC includes selecting a context based on previously input data, performing binary arithmetic coding, and updating statistic information. The context is an environment for collecting the statistic information defined by data symbols that have occurred previously and is used for a precise prediction of occurrence probabilities of occurrences of data symbols.

The compression rate of the CABAC depends on a method of modeling the context. It is advantageous to have a high compression rate, if a probability of occurrence of the least probable symbol (LPS) of the context model becomes low. However, with conventional technology, there is a problem of low efficiency, which results from a slow compression rate of coding, when an input symbol has a value unpredicted in the context model, although the efficiency of coding is high when the input symbol has a value predicted in the context model.

SUMMARY OF THE INVENTION

The present invention provides a method and an apparatus for CABAC-based encoding having an improved compression ratio by selecting a context model according to an input symbol and a computer readable recoding medium storing computer programs executing the method.

The present invention also provides a method and an apparatus for CABAC-based decoding which can decode symbols encoded by the CABAC-based encoding, and a computer readable recoding medium storing computer programs executing the method.

According to an aspect of the present invention, there is provided a method of CABAC-based encoding, the method comprising: selecting a first context model based on statistics of previously input symbols and a second context model having a value of a most probable symbol (MPS) different from that of the first context model; encoding a current input symbol using the first context model when the current input symbol has the same value as that of the MPS of the first context model, or when the second context model cannot be selected; and encoding the current input symbol using the second context model when the current input symbol has a value different from the MPS of the first context model and the second context model can be selected.

According to another aspect of the present invention, there is provided an apparatus for CABAC-based encoding, comprising: a context model selection unit selecting a first context model based on statistics of previously input symbols and a second context model having a value of an MPS different from that of the first context model; a first encoding unit encoding a current input symbol using the first context model when the current input symbol has the same value as that of the MPS of the first context model, or when the second context model cannot be selected; and a second encoding unit encoding the current input symbol using the second context model when the current input symbol has a value different from the MPS of the first context model and the second context model can be selected.

According to another aspect of the present invention, there is provided a method of CABAC-based decoding, the method comprising: selecting a first context model based on statistics of previously decoded symbols and a second context model having a value of the MPS different from that of the first context model; generating a first decoded symbol by decoding an encoded input symbol using the first context model; selecting the first decoded symbol as a result value of the CABAC-based decoding when the first decoded symbol has the same value as the value of the MPS of the first context model; and generating a second decoded symbol by decoding the encoded input symbol using the second context model when the first decoded symbol has a value different from the value of the MPS of the first context model.

According to another aspect of the present invention, there is provided an apparatus for CABAC-based decoding, comprising: a context model selection unit selecting a first context model based on statistics of previously decoded symbols and a second context model having a value of a most probable symbol (MPS) different from that of the first context model; a first decoding unit generating a first decoded symbol by decoding an encoded input symbol using the first context model; a first result value selection unit selecting the first decoded symbol as a result value of the CABAC based decoding when the first decoded symbol has the same value as the value of the MPS of the first context model; and a second decoding unit generating a second decoded symbol by decoding the encoded input symbol using the second context model when the first decoded symbol has a value different from the value of the MPS of the first context model.

BRIEF DESCRIPTION OF THE DRAWINGS

The above and other aspects of the present invention will become more apparent by describing in detail exemplary embodiments thereof with reference to the attached drawings in which:

FIGS. 5A to 5C are diagrams illustrating motion vector differences (MVDs) of macroblocks in H.264;

FIGS. 6A to 6C are diagrams of an example of context modeling in encoding a MVD of macroblocks in H.264;

DETAILED DESCRIPTION OF EXEMPLARY EMBODIMENTS OF THE INVENTION

A method and an apparatus for CABAC-based encoding or CABAC-based decoding according to exemplary embodiments of the present invention will be described in detail with reference to the accompanying drawings.

Figure 1:
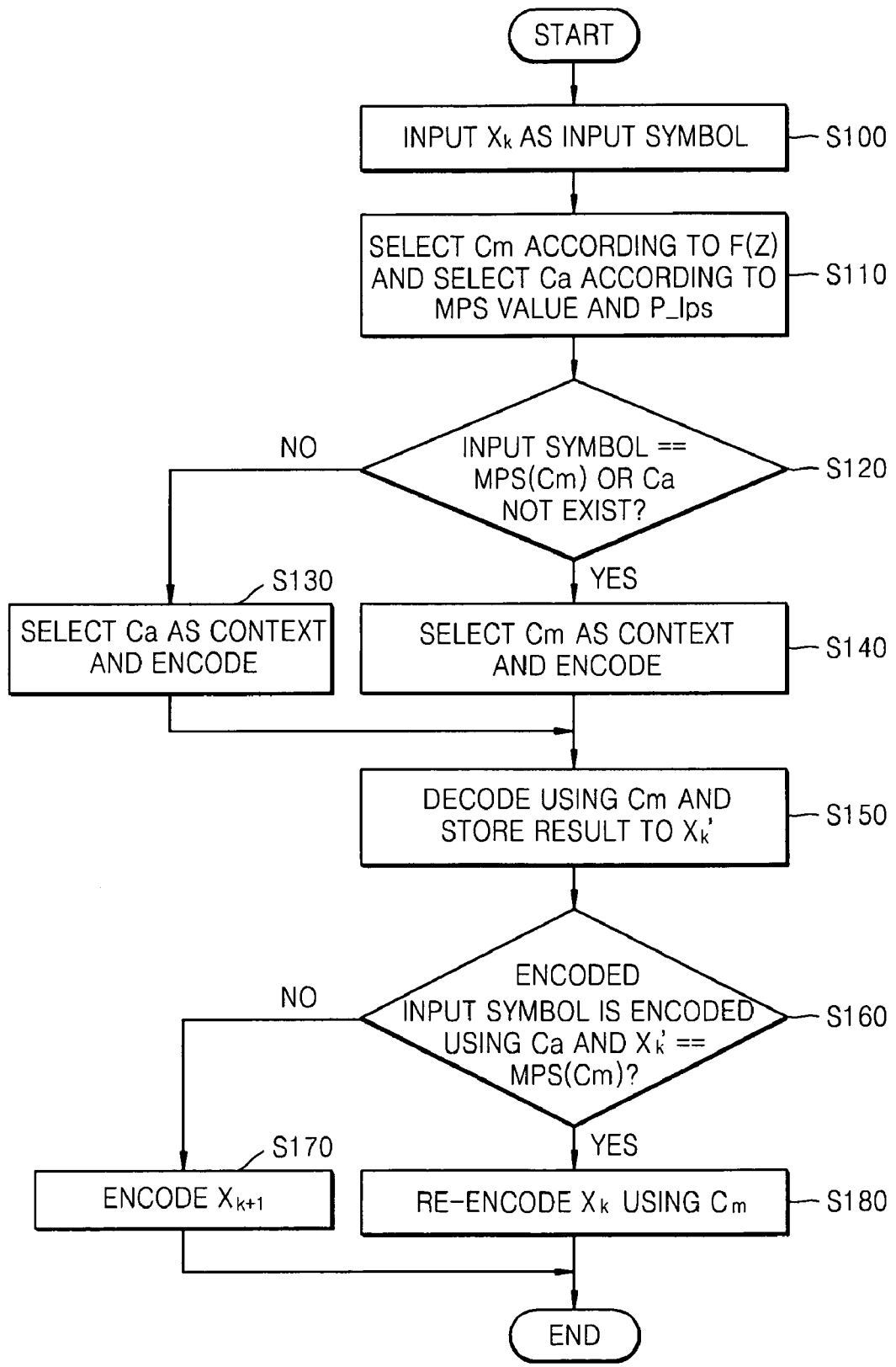
FIG. 1 is a flowchart of a method of CABAC-based encoding according to an exemplary embodiment of the present invention.

FIG. 1 is a flowchart of a method of CABAC-based encoding according to an exemplary embodiment of the present invention. First, $x_k$ is input as a current input symbol (S100). A first context model Cm is then selected based on a result of a function F(z), and a second context model Ca is selected based on a value of the most probable symbol (MPS) and a value of P_lps which is a probability of occurrence of a least probable symbol (LPS) (S110). Here, the function F(z) is a modeling function which is used to determine a context model based on statistics on previously input symbols.

The method of selecting the second context model Ca will now be described. First, Ca and Cm should have different values of the MPS. For example, when the value of the MPS of Cm is zero, one of context models having one as a value of the MPS is selected as Ca. When there is a plurality of context models having different values of the MPS, a context model having the least value of P_lps is selected. When there is a plurality of context models having the least value of P_lps, a context model that comes first in an order among the context models may be selected. The order of the context models is determined based on values of context indices indicating contexts.

When the symbol $x_k$ has the same value as a value of the MPS of Cm, or when the second context model Ca cannot be selected (Yes in S120), the input symbol is encoded using Cm according to a conventional method (S140).

An example of a case when the second context model Ca cannot be selected is when all selectable context models have the same value of the MPS as that of Cm.

When $x_k$, the input symbol has a different value from the value of the MPS of the first context model Cm, and the second context model Ca can be selected (No in S120), the compression efficiency will be lowered if the input symbol is encoded using Cm. Accordingly, the input symbol is encoded using Ca (S130).

As described above, Cm is used for encoding when the value of the input symbol is the same as the value of the MPS of Cm, while Ca is used for the encoding when the value of the input symbol is different from the value of the MPS of Cm. Thus compression efficiency can be improved by using this method.

However, according to the method, there may be an ambiguity in a decoding process as to which context model should be used for decoding. This case will be called an occurrence of an ambiguity in embodiments of the present invention.

To prevent the occurrence of the ambiguity, in exemplary embodiments of the present invention, the occurrence of the ambiguity is checked by performing a test decoding in a CABAC encoding unit, and when the occurrence of the ambiguity is determined in the encoded value by encoding stage S130, the ambiguity is removed by encoding the input symbol using the first context model Cm.

To check the occurrence of the ambiguity, at first, $x_k'$ is obtained by decoding the encoded input symbol using the first context model Cm (S150).

When the encoded input symbol is encoded using Ca, and $x_k'$ has the same value as the MPS value of Cm (Yes in S160), there is the occurrence of the ambiguity. In other words, when the encoded input symbol is decoded in a decoding process, the MPS value of Cm is obtained, so that there is a possibility that the input symbol is recognized as having been encoded using Cm. Accordingly, the input symbol should be re-encoded using Cm, in spite of a decrease in the compression efficiency (S180).

When a decoded value using Cm is different from the MPS value of Cm (No in S160), the ambiguity does not occur. Accordingly, encoding of the next input symbol $x_{k+1}$ is performed (S170).

Figure 2:
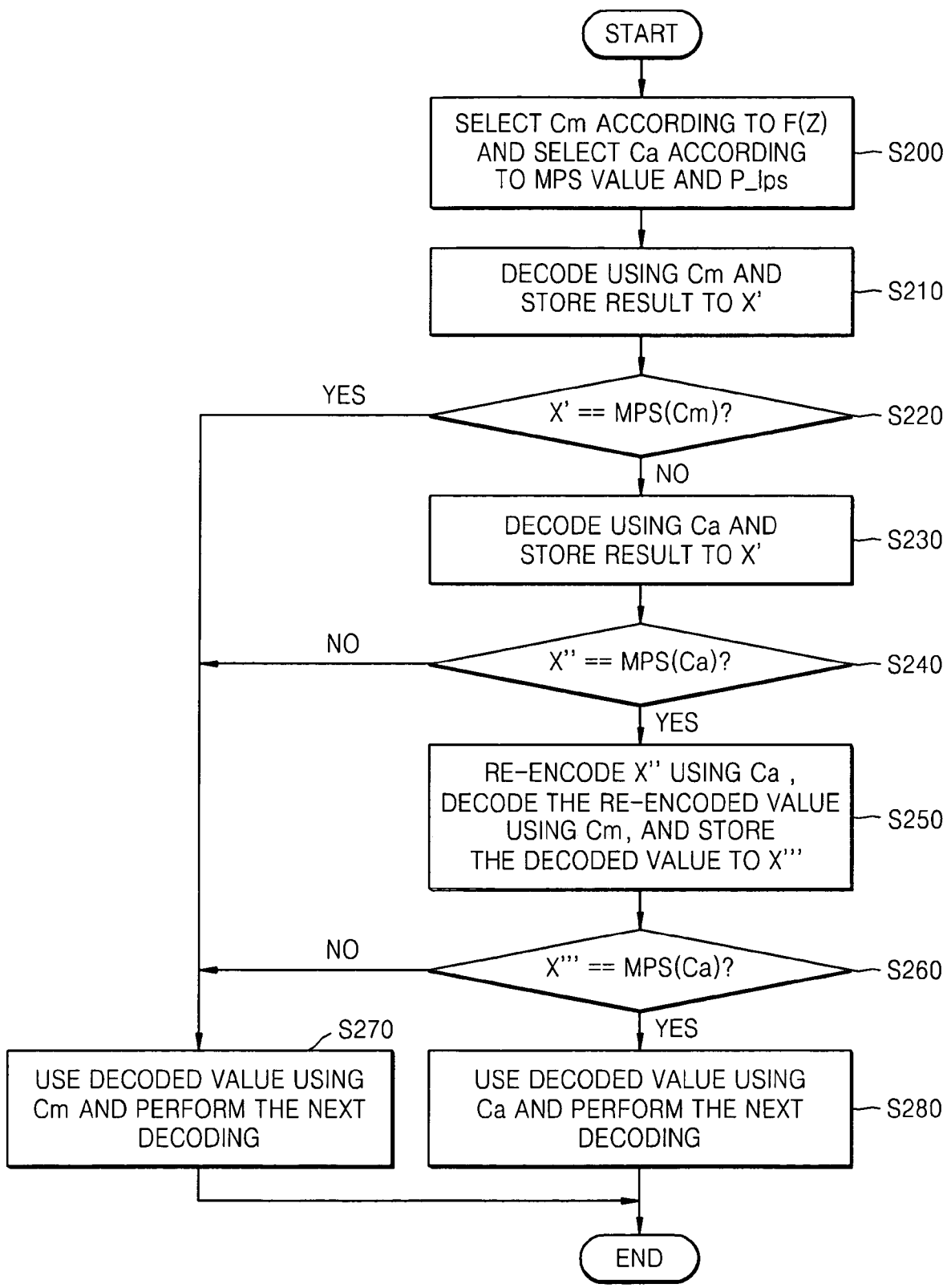
FIG. 2 is a flowchart of a method of CABAC-based decoding according to another exemplary embodiment of the present invention.

FIG. 2 is a flowchart of a method of CABAC-based decoding according to an exemplary embodiment of the present invention.

Initially, a first context model Cm is selected based on statistics of previously decoded symbols according to a modeling function F(z), and a second context model Ca which has a different MPS value from that of Cm is selected (S200). At this time, when there is a plurality of context models having different MPS values from that of Cm, a context model having the least value of P_lps is selected.

Next, an input symbol is decoded using the first context model Cm (S210). Hereinafter, a decoded symbol in the stage S210 will be called a first decoded symbol.

The first decoded symbol is compared to the MPS value of Cm (S220). When the first decoded symbol has the same value as the MPS value of Cm, the input symbol should have been encoded using the first context model Cm. Accordingly, the first decoded symbol is selected as a result value of the decoding, and decoding of the next symbol is performed (S270).

When the first decoded symbol has a value different from the MPS value of Cm, the encoded input symbol is decoded using the second context model Ca (S230). Hereinafter, a decoded value in stage S230 will be called a second decoded symbol.

The second decoded symbol is compared to an MPS value of Ca (S240). When the second decoded symbol has a value different from the MPS value of the second context model Ca, the input symbol should have been decoded using the first context model Cm. Accordingly, the first decoded symbol, which is the decoded value using Cm, is selected as the result value of the decoding, and decoding of the next input symbol is performed (S270).

When the second decoded symbol has the same value as the MPS value of Ca, the second decoded symbol is re-encoded using the Ca, and the re-encoded second decoded symbol is decoded using Cm (S250). Hereinafter, the decoded value in stage S250 will be called a third decoded symbol.

The third decoded symbol is compared to the MPS value of Ca (S260). When the third decoded symbol has the same value as the MPS value of Ca, the input symbol should have been encoded using the second context model Ca. Accordingly, the second decoded symbol is selected as a result value of the decoding, and decoding of the next input symbol is performed (S280).

When the third decoded symbol has a value different from the MPS value of Ca, the input symbol should have been decoded using the first context model Cm. Accordingly, the first decoded symbol is selected as a result value of the decoding, and decoding of the next input symbol is performed (S270).

According to the methods of CABAC-based encoding and decoding illustrated in FIGS. 1 and 2, respectively, the compression efficiency can be improved without the occurrence of the ambiguity.

Hereinafter, a principle of an exemplary embodiment of the present invention and how the occurrence of the ambiguity is prevented will be described. An exemplary embodiment of a method using the H.264 standard will be described mainly for the convenience of description.

In binary arithmetic coding (BAC), arithmetic coding (AC) of a binary input symbol is performed. The AC is a method of entropy coding which has a higher efficiency than well-known Huffman coding. In p-bit BAC, in which p bits are used, an initial interval of a number is set to $[0, 2^p)$, and the interval is divided into sub-intervals for input symbols based on probabilities of the input symbols, respectively. The interval is represented using L, a lower bound, which denotes a start value of the interval and R, a range, which denotes a length of the interval. In a case of the initial interval, L is 0, and R is $2^p - 1$. The input symbols are divided into an MPS, which is a symbol having the highest probability of occurrence, and an LPS, which is a symbol having the lowest probability of occurrence. Values of the MPS and the LPS are denoted as valMPS and valLPS, respectively.

In the BAC, probabilities of the input symbols are managed for selection of the intervals. For calculating P_mps which is a probability of occurrence of the MPS and P_lps which is a probability of occurrence of the LPS, statistics of previously input symbols are used. For example, when binary 0 input occurs 20 times and binary 1 input occurs 80 times, the value of the MPS is 1 and P_lps is 0.2. After coding of a new symbol is completed, the values of probabilities of the occurrence are adjusted to reflect the occurrence of the new symbol for the next coding. For the first input symbol, there is no statistics of the previously input symbols, so a predetermined initial value is used. Conventionally, P_lps, the probability of the occurrence of the LPS, is set to 0.5. In H.264, the statistics are obtained by analyzing moving picture data in advance, and the initial values are set based on the statistics. Only P_lps is managed, since the probability of the occurrence of the MPS can be simply calculated with a known probability of the occurrence of the LPS using the equation P_mps=1−P_lps.

Figure 7:
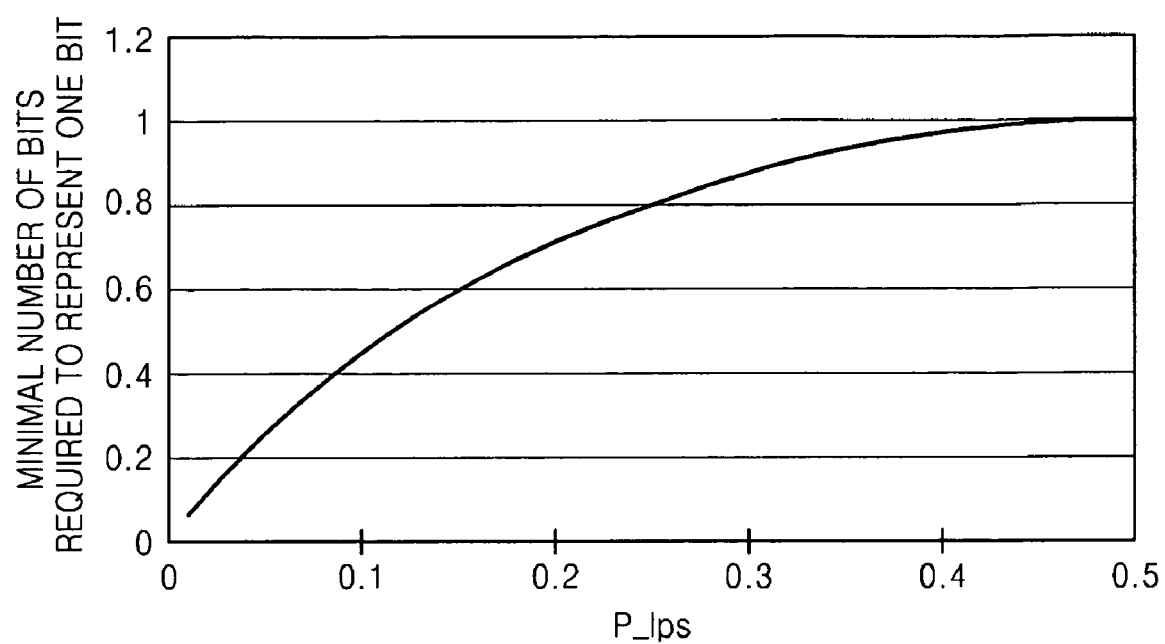
FIG. 7 is an ideal graph showing compression efficiency according to probabilities of the occurrence of a value of the LPS.

FIG. 7 is an ideal graph showing compression efficiency according to probabilities of the occurrence of the LPS. In an ideal case, the number of bits required for representing one bit is calculated according to a following Equation 1. FIG. 7 is a graph showing the minimal number of bits according to a value of P_lps.

Minimal number of bits=$P\_lps * \log 2(1/P\_lps) + P\_mps * \log 2(1/P\_mps)$ [Equation 1]

According to Equation 1, in BAC, the compression efficiency is increased as the value of P_lps decreases, since the compression efficiency is increased as a ratio of the same symbols increases in entropy coding of data having the same length. For example, a string "1111011110" can be compressed more than a string "1010100110", although the data strings have the same length of 10 bits. In the CABAC, binary input streams are divided into groups of symbols having the same values for increasing the compression efficiency. The division of the groups is according to values of symbols which have appeared previously, since statistically a current input symbol has a strong relation to values of the input symbols which have appeared previously. Here, each of the groups is called a context, and P_lps and valMPS are managed for each context.

The value of previously appeared symbols is a context determination factor, and thus called a context parameter. As an example of the context, when two contexts are to be generated for compression of 1010101010, a context including odd bits and a context including even bits may be generated. In this case, since all of the odd bits are 1, while all of the even bits are 0, high compression efficiency is obtained.

Figure 3:
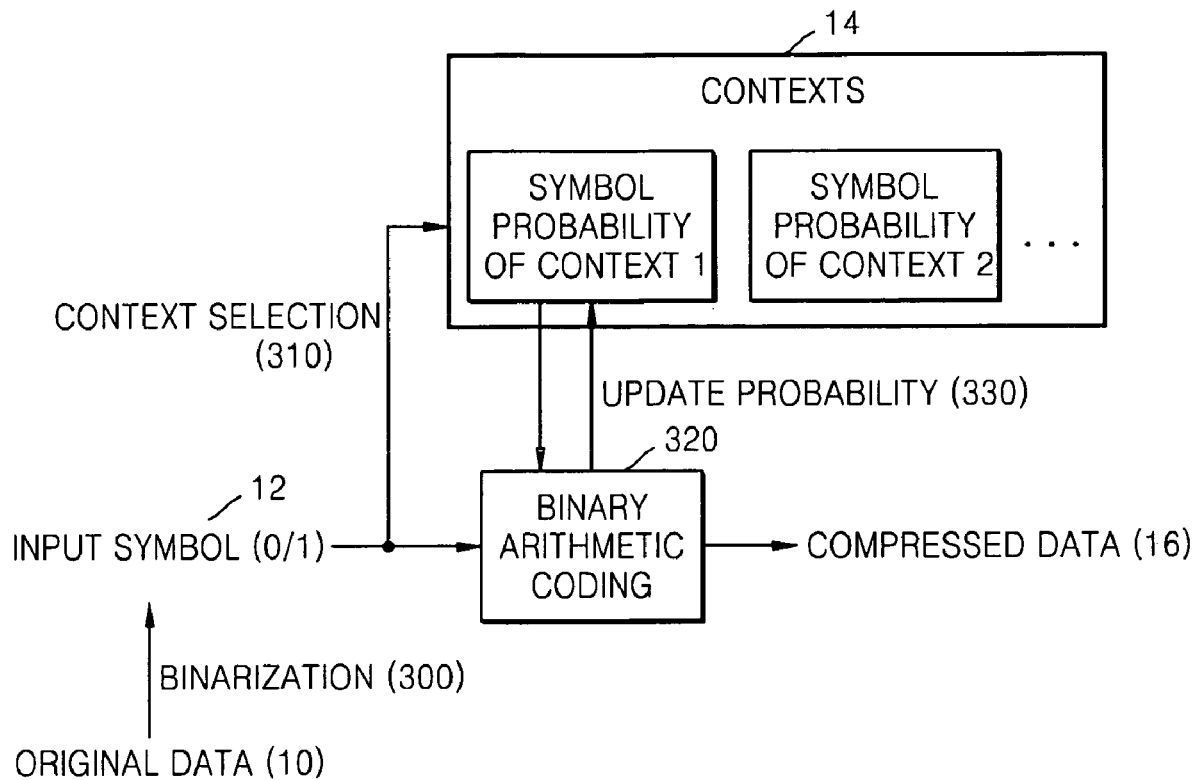
FIG. 3 is a block diagram of an apparatus for CABAC-based encoding according to another exemplary embodiment of the present invention.

FIG. 3 is a block diagram of an apparatus for CABAC-based encoding according to an embodiment of the present invention illustrating a structure of the apparatus. In CABAC, compression is performed by repeating the following stages for each value of a binary input.

Input data 10 is converted to a binary code using an appropriate method when the input data 10 is not binary (300). Next, a context is selected for each bit of the input data 10 (310).

The BAC is performed using P_lps and valMPS retrieved form the selected context and the input bit (320).

Finally, the values of probability of the selected context are updated by reflecting the currently coded bit (330).

Figure 4:
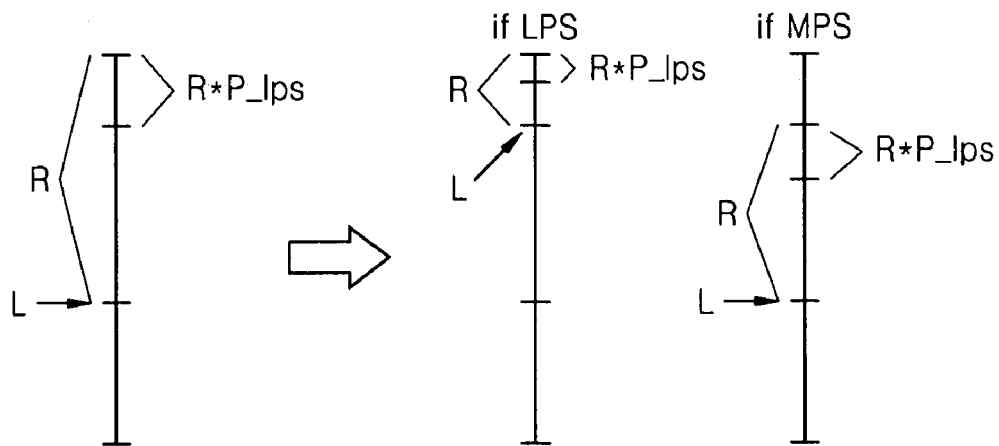
FIG. 4 shows a binary arithmetic coding algorithm according to an exemplary embodiment of the present invention.

FIG. 4 is an exemplary embodiment of a binary arithmetic coding algorithm according to the present invention.

A current interval [L, L+R), one bit input value, and the context of the input value which has values of valMPS and P_lps are used as inputs of the BAC. The interval is changed into [L, L+R*R*P_mps) or [L+R*P_mps, L+R) based on whether the value of the input bit is the MPS or the LPS, respectively.

Renormnalization is performed for preventing a situation in which an interval cannot be divided further after the interval is changed repeatedly. The renormalization is a process of expanding the current interval and storing information required for the expansion in memory.

After the coding is completed, P_lps and valMPS of the selected context are updated for reflecting the currently encoded bit. These values of P_lps and valMPS are set based on frequencies of symbols which have been input so far. For example, when, among the input symbols, binary 0 is input 20 times, and binary 1 is input 80 times, the valMPS is 1 and P_lps is 0.2.

For the first input symbol, there are no statistics of the previously input symbols, so a predetermined initial value is used. Conventionally, P_lps is set to 0.5. In the H.264 standard, the statistics are obtained by analyzing moving picture data in advance, and the initial values are set based on the statistics obtained from this analysis. The probability may be calculated by different methods other than calculating the occurrences of the input symbols.

In the BAC, since the compression efficiency is increased in compression of data having the same length when the same symbol occurs many times, a method of dividing the input symbols having the same value into a group, that is a context, is provided.

FIGS. 5A to 5C are diagrams of a motion vector difference (mvd) of a macroblock in H.264, and FIGS. 6A to 6C are examples of the context modeling for encoding a first bit of a binarized value of the mvd of the macroblock in H.264. Referring to FIGS. 5A to 5C and 6A to 6C, a method of grouping used in coding the binarized first bit of the mvd in H.264 will now be described.

Referring to FIG. 5A, if the mvd of macroblock B is currently to be encoded, the context is determined based on the mvds of a left macroblock A and an upper macroblock C. The context parameter z is determined according to values of the mvds of the macroblocks A and B. If F(z) is defined as a map from a context parameter z to a context et C which is (0,1,2) in this example, the F(z) is calculated as a following Equation 2.

$$F(0,0)=0, F(0, 1)=0, F(0,2)=0, F(0, 3)=1$$

$$F(1,0)=0, F(1, 1)=0, F(1,2)=1, F(1, 3)=1 \quad \text{[Equation 2]}$$

A decoder shares with an encoder an initial R, a mapping F determining a context, a context used when a value of the context parameter does not exist, and an initial P_lps and valMPS for each context. When the encoded data is input, P bits of the encoded data are retrieved to be set as a value of L, and the AC decoding is performed using P_lps, valMPS, L, and R. In the AC decoding process, L and R are readjusted. After the decoding is completed, P_lps and valMPS of the selected context are updated for reflecting the decoded symbol.

In context modeling, the grouping of bits having the same values is performed by analyzing a pattern of an input bit stream.

At this time, a context is determined using previous values, since statistically the context in a specific situation is related to the previous values. In the examples illustrated in FIGS. 6A to 6C, a context for the first bit of a value of a block B mvd to be currently encoded is determined from values of the blocks A and C. As illustrated in FIG. 6B, when the value of the mvd of the blocks A and C is two, the context for the first bit of the value of the mvd of the block B is set to 1. In this situation, the compression efficiency can be increased using the context 1, since there is a high probability that the values of the symbols are mostly 1. This is because the compression efficiency is increased as the occurrence of symbols having the same values increases.

However, if the mvd of the block B is 0 as in FIG. 5C, selecting a different context is advantageous in terms of compression, since the value of the first bit of the mvd is not 1.

According to an exemplary embodiment of the present invention, there is provided a method of improving coding efficiency of an input having an undesirable pattern by selecting a context based on a situation.

Figure 8:
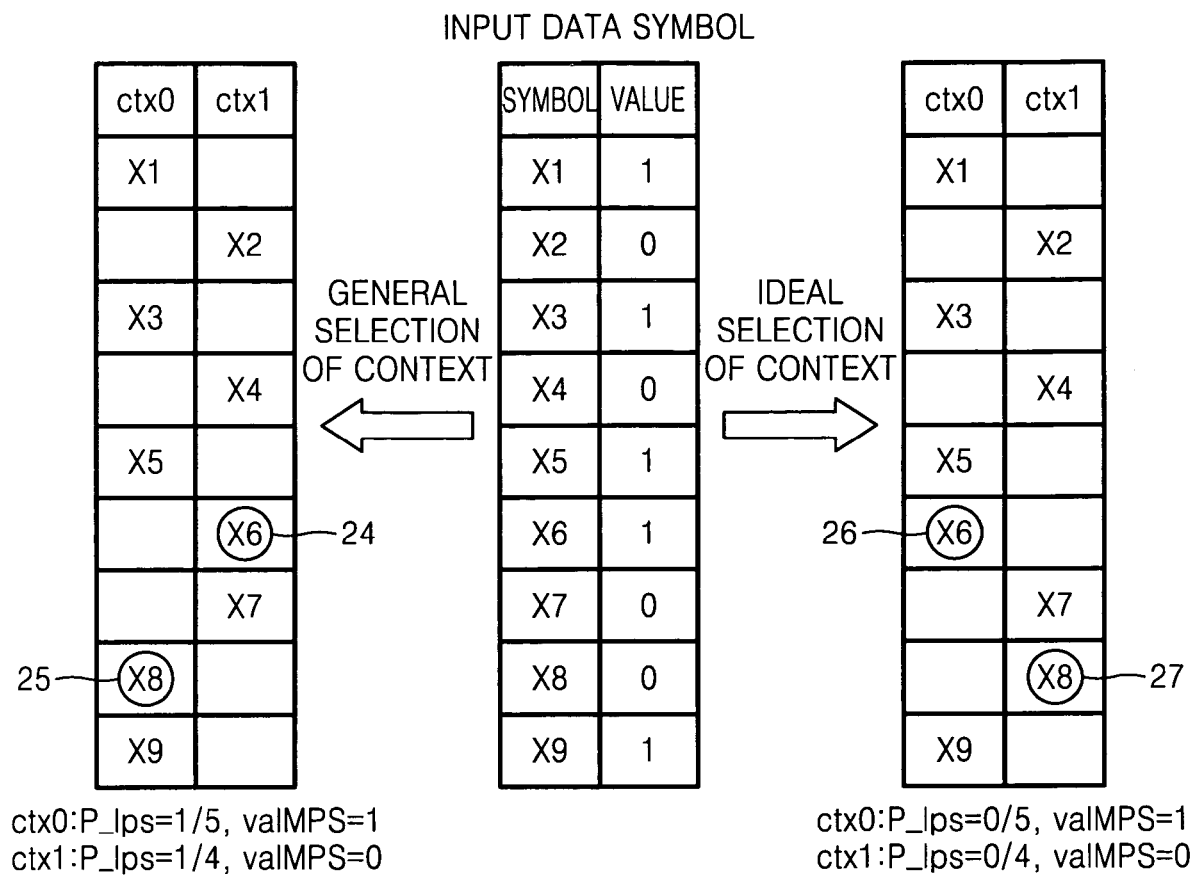
FIG. 8 is a diagram for comparing conventional context modeling and context modeling according to an exemplary embodiment of the present invention.

FIG. 8 is a diagram illustrating conventional context modeling and context modeling according to an exemplary embodiment of the present invention for comparison. Referring to FIG. 8, the context model uses a value of a symbol that occurred right before the current symbol, and, in this case, P_lps of context 0 ctx0 and context 1 ctx1 is ⅕ and ¼, respectively. This model is created based on an assumption that 0 and 1 occur one after the other. However, in the example in FIG. 8, input x6 and x8 are input differently from the predictive pattern. In this case, the contexts for x6 and x8 should be changed to different contexts to increase the efficiency of coding.

In a method of CABAC-based decoding according to an embodiment of the present invention, there is provided a modeling method capable of maintaining a value of P_lps as a low value, using values of the P_lps and valMPS as a hint which are included in each context model as context parameters when a context model is selected. The Ca is a context model which becomes a candidate for selection in order to increase the efficiency of coding.

In a CABAC-based encoding algorithm according to an embodiment of the present invention, coding is performed using the selected first context model when the current input is the same as the MPS of the selected first context, and coding is performed using the second context model, of which the value of the MPS is the value of the current input, when the current input is different from the MPS of the selected first context.

In the example illustrated in FIG. 8, for input symbols x1 to x5, x7, and x9, the first context model Cm which has been selected previously is used, and for input symbols x6 and x8, a different context model that increases the coding efficiency is used when the occurrence of the ambiguity does not occur in decoding. Therefore, the context model of which the valMPS is the same as a value of the input symbol, and the P_lps has the lowest value is used. When there is no context model that matches this condition, the context model that has been selected previously is used, and when there are several context models that match the condition, a context model that appears first in an order among the context models is selected. Coding using a newly selected context model Ca increases the coding efficiency, since input symbols are encoded using a context model in which there is a high probability of occurrence of the input symbol. However, there may be a case when decoding of the encoded symbol is impossible due to the occurrence of the ambiguity in decoding. Accordingly, the occurrence of the ambiguity should be prevented. To do this, the encoder checks for the occurrence of the ambiguity while performing test decoding, and when the occurrence of the ambiguity is determined, the encoder encodes the input symbol using the context model which has been previously selected.

Figure 9:
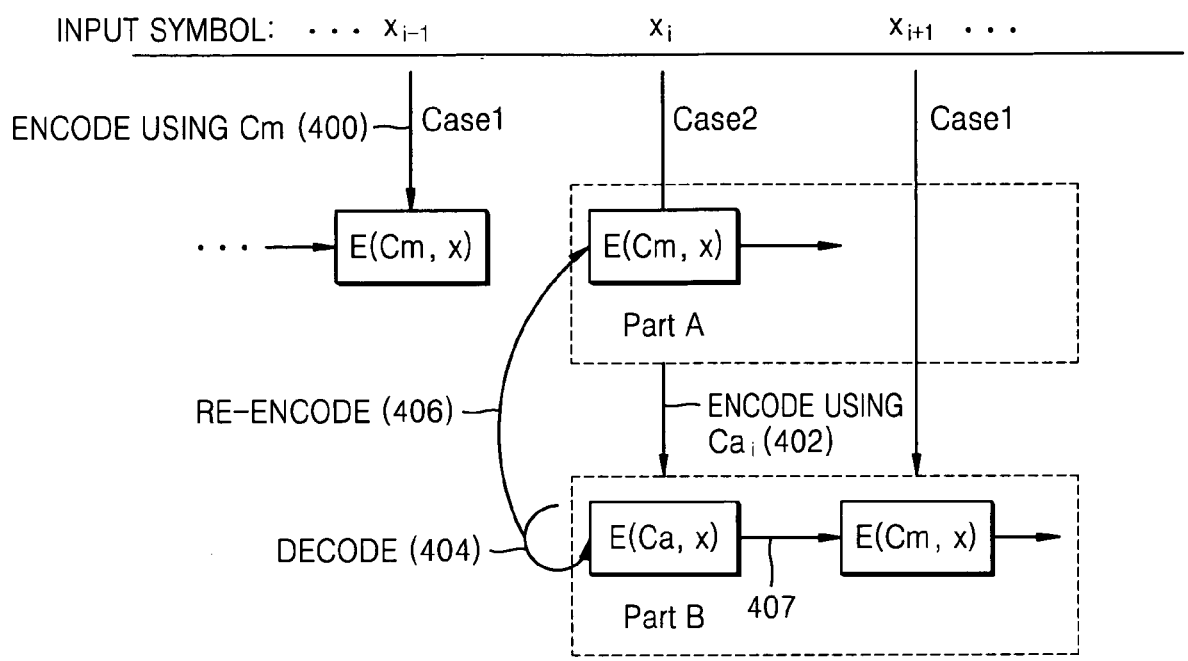
FIG. 9 is a block diagram of a method of the CABAC-based encoding according to an exemplary embodiment of the present invention.

FIG. 9 is a diagram of a method of CABAC-based encoding according to an exemplary embodiment of the present invention illustrating stages performed according to a progress of input symbols. In FIG. 9, Case1 is a case when $x_i$ and valMPS of $Cm_i$ have the same values, and Case2 is a case when the $x_i$ and the valMPS of $Cm_i$ have different values.

At first, when $x_i$ is an LPS of the $Cm_i$, encoding using $Ca_i$ is performed (402). The encoder checks whether unique encoding is possible when $x_i$, which has been encoded using $Ca_i$, is found while decoding the coded data (404). When unique decoding is possible, the next stage is performed (407). When the unique encoding is not possible, re-encoding from $x_i$ is performed when the unique encoding is not possible. The $Cm_i$ instead of $Ca_i$ should be used in the re-encoding. In other words, the occurrence of the ambiguity is prevented using a rule which predicts a situation in a decoding process during the encoding process, and a context selected in the conventional method is selected when the occurrence of the ambiguity is predicted.

The prevention of the occurrence of the ambiguity will now be described.

The encoder performs test decoding on encoded data α during an encoding process for checking the occurrence of the ambiguity, each time. Encoding using a new context model is performed only when the occurrence of the ambiguity is not determined.

The following is a context model selection method of the encoding algorithm.

Encode($x_i$)
 e1. DETERMINE $Cm_i$, $Ca_i$
 e2. E($Cm_i$, $x_i$)
 e3. if ($x_i$==mps(Cm) or $Ca_i$ DOES NOT EXIST)
 e4. Encode($x_{i+1}$)
 e5. else ($x_i$ IS LPS OF Cm AND THERE IS ANOTHER CONTEXT MODEL HAVING $x_i$ AS MPS)
 e6. E($Ca_i$, $x_i$)
 e7. if (CURRENTLY DECODED $x_i$ IS SYMBOL ENCODED USING Ca AFTER DECODING α)
 e8. if($D_i(Cm_i$, α==mps($Cm_i$))

e9. RE-ENCODE STARTING FROM $x_i$. AT THIS TIME, Cm IS USED.
    ea. else
    eb. next Encode( ) (NO OCCURRENCE OF AMBIGUITY IN CASE OF ENCODING USING Ca)

In this encoding algorithm, according to the stages of e8 and e9, it is guaranteed that a result of decoding of the encoded x using Cm is always mps(Ca).

The selection of the context model of the decoder is performed as below.

Decode($\alpha$, i) (DECODE ith SYMBOL $x_i$)
    d1. DETERMINE $Cm_i$, $Ca_i$
    d2. if ($D_i$(Cm, $\alpha$)==mps(Cm))
    d3. Decode($\alpha$, i+1) (DECODE USING Cm AND PROCEED TO THE NEXT SYMBOL)
    d4. else if (($D_i$(Ca, $\alpha$==mps(Ca)) (IN THIS CASE, RESULT OF DECODING USING Cm IS mps(Ca), TOO)
    d5. if ($D_i$(Cm, E(Ca, mps(Ca)))==mps(Ca))
    d6. $D_i$(Ca, $\alpha$, Decode($\alpha$, i+1) (DECODE USING Ca AND PROCEED TO THE NEXT SYMBOL)
    d7. $D_i$(Cm, $\alpha$, Decode($\alpha$, i+1) (DECODE USING Cm AND PROCEED TO THE NEXT SYMBOL)

To show that unique encoding is possible, it may be shown that a context model used for encoding $x_i$ is always the same as a context used for decoding the encoded $x_i$. Since the P_lps and valMPS are maintained in the encoder and the decoder in the same way, P_lps and valMPS in the decoder right before decoding $x_i$ are the same as P_lps and valMPS in the encoder right before encoding $x_i$. Accordingly, in this case, the same $Cm_i$ or $Ca_i$ is selected in the encoder and in the decoder. When Ca does not exist, only Cm is used for encoding and decoding, so that there is no problem of the occurrence of the ambiguity. Accordingly, only a case when Ca exists may be considered.

According to the encoding algorithm, E(Cm,x) is performed when the input symbol x is mps(Cm). E(Cm, x) or E(Ca, x) is performed when the input symbol x is not mps(Cm). The cases may be represented as the following Equations 3 to 5, respectively, when the encoded data are denoted a1, a2, and a3.

$$a1 = E(Cm, mps(Cm)) \quad \text{[Equation 3]}$$

$$a2 = E(Ca, mps(Ca)) \quad \text{[Equation 4]}$$

$$a3 = E(Cm, mps(Ca)) \quad \text{[Equation 5]}$$

In the case of Equation 3, since $D_i$(Cm, a1)==mps(Cm), a result of stage d2 is true, so that decoding using the same context model is performed.

In the case of Equation 4, a result of stage d2 is false and a result of stage d4 is true according to the stages e8 and e9.

In the case of Equation 5, a result is always mps(Ca) when decoding using Ca or Cm. Accordingly, the result of stage d2 is false and the result of stage d4 is true. In Equations 4 and 5, since context models are differentiated by applying stages e8 and e9 in the encoding, when stages e7 and e8 are applied in stage d5, whether it is a case of Equation 4 OR 5 can be determined according to the result of the application. As described above, since, in the encoder and the decoder, the same context models are always used for a specific input symbol, the original input data can be restored by the decoding process.

According to an exemplary embodiment of the present invention, the compression efficiency is increased. In the present invention, performance of compression of moving pictures can be improved, since CABAC is commonly used in compression of multimedia data such as H.264. Although complexity of the encoder and the decoder is increased to some degree for implementing the method according an embodiment of to the present invention, it is not a concern since performance of hardware is being improved continuously.

The invention can also be embodied as computer readable codes on a computer readable recording medium. The computer readable recording medium is any data storage device that can store data which can be thereafter read by a computer system that includes an apparatus having a function of information processing. Examples of the computer readable recording medium include a read-only memory (ROM), a random-access memory (RAM), a CD-ROM, a magnetic tape, a floppy disk, an optical data storage device, and the like.

According to a method and an apparatus for CABAC-based encoding or decoding, a compression ratio of encoding by additional selection of a context model using a current input symbol together with a general selection of a context based on statistics of previously input symbols can be improved. In addition, an original input data can be restored correctly without an ambiguity occurrence, since the occurrence of the ambiguity is prevented by performing test decoding during an encoding process.

While the present invention has been particularly shown and described with reference to exemplary embodiments thereof, it will be understood by those skilled in the art that various changes in form and details may be made therein without departing from the spirit and scope of the present invention as defined by the appended claims. The exemplary embodiments should be considered in descriptive sense only and not for purposes of limitation. Therefore, the scope of the invention is defined not by the detailed description of the exemplary embodiments but by the appended claims, and all differences within the scope will be construed as being included in the present invention.

What is claimed is:

1. A method of context-based adaptive binary arithmetic coding (CABAC)-based encoding, the method comprising:
    selecting a first context model based on statistics of previously input symbols and a second context model having a value of a most probable symbol (MPS) different from that of the first context model;
    encoding a current input symbol using the first context model if the current input symbol has a same value as that of the most probable symbol of the first context model, or if the second context model cannot be selected; and
    encoding the current input symbol using the second context model if the current input symbol has a value different from the most probable symbol of the first context model and the second context model can be selected.

2. The method of claim 1, further comprising:
    decoding, using the first context model, an encoded input symbol which has been encoded using the first or second context model; and
    encoding the current input symbol using the first context model if the encoded input symbol has been generated by encoding the current input symbol using the second context model, and a decoded value of the encoded input symbol is the same as the value of the most probable symbol of the first context model.

3. The method of claim 1, wherein the selecting of the first and second context models comprises selecting a context model having a smallest value of a probability of occurrence of a least probable symbol (LPS) among one or more context models, each of which has a value of the most probable symbol different from that of the first context model as the second context model.

4. An apparatus for context-based adaptive binary arithmetic coding (CABAC)-based encoding, the apparatus comprising:

a context model selection unit which selects a first context model based on statistics of previously input symbols, and a second context model having a value of a most probable symbol (MPS) different from that of the first context model;

a first encoding unit which encodes a current input symbol using the first context model if the current input symbol has a same value as that of the most probable symbol of the first context model, or if the second context model cannot be selected; and a second encoding unit which encodes the current input symbol using the second context model if the current input symbol has a value different from the most probable symbol of the first context model and the second context model can be selected.

5. The apparatus of claim 4 further comprising:

a symbol decoding unit which decodes using the first context model, an encoded input symbol which has been encoded using the first or second context model; and a third encoding unit which encodes the current input symbol using the first context model if the encoded input symbol has been generated by encoding the current input symbol using the second context model, and a decoded value of the encoded input symbol is the same as the value of the most probable symbol of the first context model.

6. The method of claim 4, wherein the context model selection unit selects a context model having a smallest value of a probability of occurrence of a least probable symbol among one or more context models, each of which has a value of the most probable symbol different from that of the first context model as the second context model.

7. A method of context-based adaptive binary arithmetic coding (CABAC)-based decoding, the method comprising:

selecting a first context model based on statistics of previously decoded symbols and a second context model having a value of a most probable symbol (MPS) different from that of the first context model;

generating a first decoded symbol by decoding an encoded input symbol using the first context model;

selecting the first decoded symbol as a result value of the CABAC-based decoding if the first decoded symbol has a same value as the value of the most probable symbol of the first context model; and generating a second decoded symbol by decoding the encoded input symbol using the second context model if the first decoded symbol has a value different from the value of the most probable symbol of the first context model.

8. The method of claim 7, further comprising:

selecting the first decoded symbol as a result value of the CABAC-based decoding if the second decoded symbol has a value different from the value of the most probable symbol of the second context model;

encoding the second decoded symbol using the second context model and thereby generating a third decoded symbol by decoding a result of the encoding of the second decoded symbol using the first context model if the second decoded symbol has the same value as the value of the most probable symbol of the second context model;

selecting the second decoded symbol as the result value of the CABAC based decoding if the third decoded symbol has the same value as the value of the most probable symbol of the second context model; and selecting the first decoded symbol as the result value of the CABAC based decoding if the third decoded symbol has a value different from the value of the most probable symbol of the second context model.

9. The method of claim 7, wherein the selecting of the first and second context models comprises selecting a context model having a smallest value of a probability of occurrence of a least probable symbol among one or more context models, each of which has a value of the most probable symbol different from that of the first context model as the second context model.

10. An apparatus for context-based adaptive binary arithmetic coding (CABAC)-based decoding, the apparatus comprising:

a context model selection unit which selects a first context model based on statistics of previously decoded symbols and a second context model having a value of a most probable symbol (MPS) different from that of the first context model;

a first decoding unit which generates a first decoded symbol by decoding an encoded input symbol using the first context model;

a first result value selection unit which selects the first decoded symbol as a result value of the CABAC based decoding if the first decoded symbol has a same value as the value of the most probable symbol of the first context model; and a second decoding unit which generates a second decoded symbol by decoding the encoded input symbol using the second context model if the first decoded symbol has a value different from the value of the most probable symbol of the first context model.

11. The apparatus of claim 10, further comprising:

a second result value selection unit which selects the first decoded symbol as a result value of the CABAC based decoding if the second decoded symbol has a value different from the value of the most probable symbol of the second context model;

a third decoding unit which encodes the second decoded symbol using the second context model and thereby generating a third decoded symbol by decoding a result of the encoding of the second decoded symbol using the first context model if the second decoded symbol has the same value as the value of the most probable symbol of the second context model;

a third result value selection unit which selects the second decoded symbol as the result value of the CABAC based decoding if the third decoded symbol has the same value as the value of the most probable symbol of the second context model; and a fourth result value selection unit which selects the first decoded symbol as the result value of the CABAC based decoding if the third decoded symbol has a value different from the value of the most probable symbol of the second context model.

12. The apparatus of claim 10, wherein the context model selection unit selects a context model having a smallest value of a probability of occurrence of a least probable symbol among one or more context models, each of which has a value of the most probable symbol different from that of the first context model as the second context model.

13. A computer-readable recording medium having recorded thereon a program for implementing a method of context-based adaptive binary arithmetic coding (CABAC)-based encoding, the method comprising:

selecting a first context model based on statistics of previously input symbols and a second context model having a value of a most probable symbol (MPS) different from that of the first context model;

encoding a current input symbol using the first context model if the current input symbol has a same value as that of the most probable symbol of the first context model, or if the second context model cannot be selected; and encoding the current input symbol using the second context model if the current input symbol has a value different from the most probable symbol of the first context model and the second context model can be selected.

14. A computer-readable recording medium recording a computer program implementing a method of context-based adaptive binary arithmetic coding (CABAC)-based decoding, the method comprising:

selecting a first context model based on statistics of previously decoded symbols and a second context model having a value of a most probable symbol (MPS) different from that of the first context model;

generating a first decoded symbol by decoding an encoded input symbol using the first context model;

selecting the first decoded symbol as a result value of the CABAC-based decoding if the first decoded symbol has a same value as the value of the most probable symbol of the first context model; and generating a second decoded symbol by decoding the encoded input symbol using the second context model if the first decoded symbol has a value different from the value of the most probable symbol of the first context model.

* * * * *